United States Patent
Park et al.

(10) Patent No.: US 7,825,576 B2
(45) Date of Patent: Nov. 2, 2010

(54) PIXEL STRUCTURE AND ORGANIC LIGHT EMITTING DEVICE INCLUDING THE PIXEL STRUCTURE

(75) Inventors: Joon-Yong Park, Yongin-si (KR); Euk-Che Hwang, Yongin-si (KR); Sang-Yeol Kim, Yongin-si (KR); Sung-Hun Lee, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 424 days.

(21) Appl. No.: 11/648,611

(22) Filed: Jan. 3, 2007

(65) Prior Publication Data
US 2007/0164670 A1 Jul. 19, 2007

(30) Foreign Application Priority Data
Jan. 13, 2006 (KR) .................... 10-2006-0003940

(51) Int. Cl.
*H05B 33/26* (2006.01)
(52) U.S. Cl. .................................... 313/498; 315/169.3
(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

U.S. PATENT DOCUMENTS

| 5,294,869 A | * | 3/1994 | Tang et al. | ................... 313/504 |
| 6,800,999 B1 | * | 10/2004 | Duggal et al. | ............ 315/169.1 |
| 2004/0051444 A1 | | 3/2004 | Schaepkens et al. | |
| 2004/0251822 A1 | * | 12/2004 | Birnstock et al. | ........... 313/506 |
| 2005/0082966 A1 | * | 4/2005 | Yamazaki et al. | ........... 313/498 |

OTHER PUBLICATIONS

Transmitter letter and Chinese Office Action issued by Chines Patent Office on Aug. 14, 2009 in the corresponding Chinese Patent Application 2007100020081.

\* cited by examiner

*Primary Examiner*—Peter J Macchiarolo
*Assistant Examiner*—Donald L Raleigh
(74) *Attorney, Agent, or Firm*—Robert E. Bushnell, Esq.

(57) ABSTRACT

A pixel structure and an organic light emitting device including the pixel structure has at least one electronic material layer arranged between a lower electrode and an upper electrode. The pixel structure includes the lower electrode arranged in a desired pattern on a substrate and a bank covering the substrate on which the lower electrode is arranged, and defining an opening portion to expose at least a portion of the lower electrode. The area of the opening portion is greater than that of the exposed portion of the lower electrode. The pixel structure further includes an electronic material layer arranged in the opening portion and covering an upper surface of the lower electrode, and the upper electrode arranged on the electronic material layer.

13 Claims, 3 Drawing Sheets

PIXEL STRUCTURE AND ORGANIC LIGHT EMITTING DEVICE INCLUDING THE PIXEL STRUCTURE

CLAIM OF PRIORITY

This application makes reference to, incorporates the same herein, and claims all benefits accruing under 35 U.S.C. §119 from an application for PIXEL STRUCTURE AND ORGANIC LIGHT EMITTING DEVICE COMPRISING THE SAME, earlier filed in the Korean Intellectual Property Office on the 13 Jan. 2006 and there duly assigned Ser. No. 10-2006-0003940.

BACKGROUND OF THE INVENTION

1. Field of the Invention

The present invention relates to a pixel structure and an organic light emitting device including the pixel structure, and more particularly, the present invention relates to a pixel structure having at least one electronic material layer between an upper electrode and a lower electrode, the pixel structure reducing electrical shorts between the upper and lower electrodes and improving a profile of the electronic material layer, and an organic light emitting device including the pixel structure.

2. Description of the Related Art

Generally, an organic light emitting device, e.g., an Organic Light Emitting Diode (OLED) uses an organic electroluminescence phenomenon in which excitons are formed by recombination of electrons and holes injected respectively through a cathode and an anode in a small molecular or polymer organic thin film. A specific wavelength of light is produced from the energy of the excitations.

Organic light emitting devices include pixel arrays in which a plurality of OLEDs are densely arranged. Each of the OLEDs, which is the smallest unit that emits light, is referred to as a pixel. In a device exhibiting a color image, three pixels emitting red, green and blue light respectively constitute one exhibiting unit. An array of exhibiting units are arranged into a display panel.

An OLED includes an anode, a cathode and an organic light emitting layer arranged between the anode and the cathode. The organic light emitting layer can be classified into several layers according to its function. It can be formed of a multi-layered structure including an Emitting Material Layer (EML), and further including at least one of a Hole Injecting Layer (HIL), a Hole Transporting Layer (HTL), a Hole Blocking Layer (HBL), an Electron Transporting Layer (ETL), and an Electron Injecting Layer (EIL).

This OLED includes an organic light emitting layer formed on a lower electrode corresponding to one of the anode and the cathode using various methods, such as, an inkjet method, dispensing, or photo-to-heat transferring, and an upper electrode corresponding to the other of the anode and the cathode on the organic light emitting layer. An organic light emitting layer needs to cover a lower electrode while keeping a uniform thickness in order to prevent shorts between two electrodes and further to obtain a uniform brightness for multiple pixels.

In forming an organic light emitting layer using dispensing or an ink-jet technique, some solutions have been proposed to satisfy the need for the organic light emitting layer to cover the lower electrode while keeping a uniform thickness. One of the solutions is to adjust the surface energy of upper and side surfaces of banks defining an opening portion to be filled with a fluid organic light emitting layer material on the lower electrode and to adjust the surface energy of an exposed surface of the lower electrode through the opening portion. But, this solution is accompanied with difficult processes for arranging a fine mask exactly and for conducting a surface procedure. Another of the solutions is to provide a tap in a section of the banks. By using this method, it is difficult to optimize a developing and etching condition of the banks.

SUMMARY OF THE INVENTION

The present invention provides a pixel structure having at least one electronic material layer arranged between lower and upper electrodes, the pixel structure designed to facilitate an ink-jet or dispensing process of forming the electronic material layer, to reduce the possibility of electrical shorts between the lower and upper electrodes, and to improve the profile of the electronic material layer on the lower electrode, and an organic light emitting device including the pixel structure.

According to one aspect of the present invention, a pixel structure is provided including: at least one electronic material layer arranged between a lower electrode and an upper electrode; a substrate having the lower electrode arranged in a desired pattern thereon; and a bank covering the substrate having the lower electrode is arranged thereon, and defining an opening portion to expose at least a portion of the lower electrode; the opening portion has an area greater than that of the exposed portion of the lower electrode.

The lower electrode preferably includes either a width-constant linear or dot-shaped pattern and the opening portion of the bank preferably has a width greater than that of the lower electrode.

The bank is preferably arranged to have equal-sized margins between sidewalls of the opening portion and sides of the lower electrode.

According to another aspect of the present invention, a pixel structure is provided including: at least one electronic material layer arranged between a lower electrode and an upper electrode; a substrate having the lower electrode arranged in a desired pattern thereon; a bank covering the substrate having the lower electrode arranged thereon, and defining an opening portion to expose at least a portion of the lower electrode, the opening portion having an area greater than that of the exposed portion of the lower electrode; and an electronic material layer arranged in the opening portion and covering both an upper surface of the lower electrode and the upper electrode arranged on the electronic material layer.

The electronic material layer is preferably formed by coating a fluid electronic material in the opening portion and drying the fluid electronic material. The electronic material layer is preferably coated by one of dispensing, ink-jet or spin coating.

The lower electrode preferably includes either a width-constant linear or dot-shaped pattern and the opening portion of the bank preferably has a width greater than that of the lower electrode.

The bank is arranged to preferably have equal-sized margins between sidewalls of the opening portion and sides of the lower electrode.

According to still another aspect of the present invention, an organic light emitting device is provided including: a pixel structure having at least one electronic material layer arranged between a lower electrode and an upper electrode, the pixel structure including: a substrate having the lower electrode arranged in a desired pattern thereon; a bank covering the substrate having the lower electrode arranged thereon, and defining an opening portion to expose at least a portion of the lower electrode, the opening portion having an area greater than that of the exposed portion of the lower electrode; and an organic light emitting material layer arranged in the opening portion and covering both an upper surface of the lower electrode and the upper electrode arranged on the organic light emitting material layer.

The organic light emitting material layer is preferably formed by coating the opening portion with a fluid material and drying the fluid material. The organic light emitting material layer is preferably formed by one of dispensing, ink-jet or spin coating.

The lower electrode preferably includes either a linear or dot-shaped pattern and the opening portion of the bank preferably has a width greater than that of the lower electrode.

The bank is preferably arranged to have equal-sized margins between sidewalls of the opening portion and sides of the lower electrode.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicated the same or similar components, wherein.

DETAILED DESCRIPTION OF THE INVENTION

Hereinafter, the present invention is described in detail with reference to the attached drawings.

Figure 1:
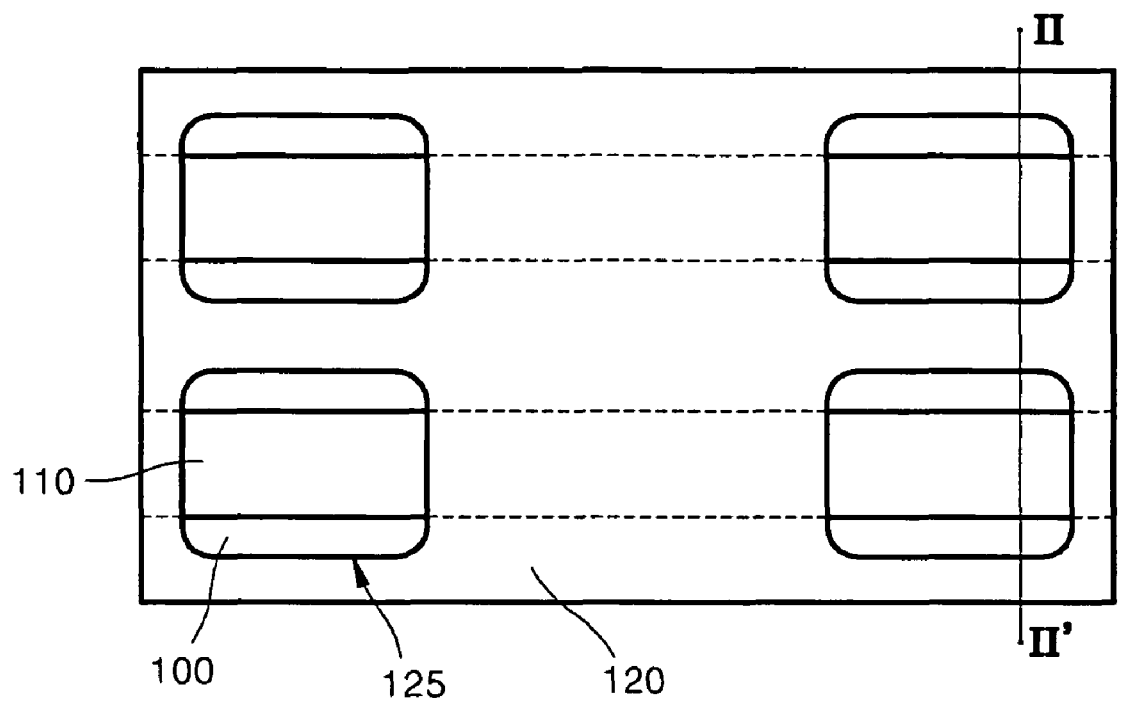
FIG. 1 is a plan view of lower electrodes and a bank of a pixel structure according to an embodiment of the invention.

FIG. 1 is a plan view of lower electrodes 110 and a bank 120 of a pixel structure according to an embodiment of the invention. The lower electrodes 110 are provided on a substrate 100 in a width-constant linear pattern. The bank 120 covers the substrate 100 and the lower electrodes 110 and opening portions 125 are provided in the bank 120 to expose the lower electrodes 110. The width of the opening portions 125 is greater than that of the lower electrodes 110. The opening portions 125 can be arranged to have substantially the same margin in both directions from a center of the lower electrodes 110.

At least an upper surface of the substrate 100 has an electrical insulating property and the substrate 100 can be formed of a single insulating material or a plate-shaped structure including other electronic elements, such as a switching element. For example, when the pixel structure according to the current embodiment of the present invention is applied to a rear emission organic light emitting display, the substrate 100 can be a transparent plastic or organic substrate.

The lower electrodes 110 can be transparent electrodes, reflective electrodes or other conductive electrodes having a desired pattern. The desired pattern denotes a pattern that varies according to a property of the device to which the pixel structure is applied. For example, in a pixel structure applied to a passive matrix organic light emitting display, the desired pattern can be a linear pattern of width-constant bands. In a pixel structure applied to an active matrix organic light emitting display, the desired pattern can be a pattern of pads having a rectangular, circular, or elliptical shape, etc.

The bank 120 is an insulating layer covering the substrate 100 on which the lower electrodes 110 are formed. The bank 120 has opening portions 125 to expose at least a portion of the lower electrodes 110. The area of the opening portions 125 is greater than the area of the exposed portion of the lower electrodes 110 and the shape of the opening portions 125 depends upon the shape of the lower electrodes 110. When the lower electrodes 110 are formed in a linear pattern as illustrated in FIG. 1, the opening portions 125 can have a rectangular shape with a width greater than that of the lower electrodes 110. When filling an electronic material in the opening portions 125, the electronic material is sometimes not sufficiently filled in a portion near to the inner walls of the opening portions 125. Thus, to prevent this problem, the opening portions 125 have margins at both sides of the lower electrodes 110. In particular, when filling an electronic material using a dispensing method, it is preferable to provide a margin in a direction perpendicular to the direction in which the dispensing needle travels.

Figure 2:
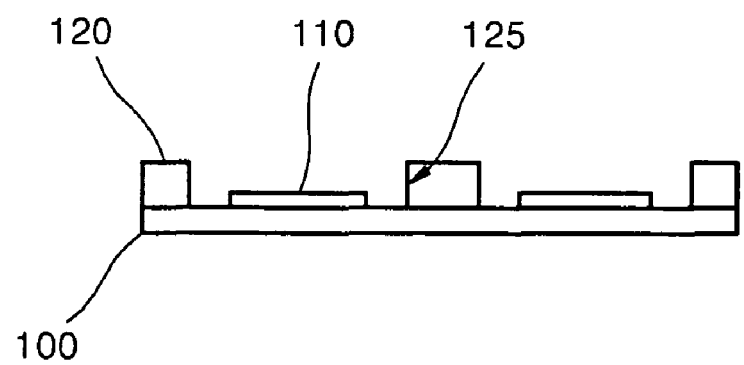
FIG. 2 is a cross-sectional view of the pixel structure taken along a line II-II of FIG. 1, according to an embodiment of the present invention.

FIG. 2 is a cross-sectional view of the pixel structure taken along a line II-II of FIG. 1, according to an embodiment of the present invention. As illustrated in FIG. 2, one of the opening portions 125 of the bank 120 exposes one of the lower electrodes 110 along with a portion of the substrate 100 through the margins of the opening portion 125. This bank 120 can be easily formed using a variety of conventional methods such as wet or dry etching. The above-described pixel structure, including the lower electrodes 110 and the bank 120, can be applied to various electronic devices. In particular, it can be applied to an electronic device including an electronic material layer (not shown) formed by filling a fluid electronic layer material in the opening portion 125 and drying it and an upper electrode (not shown) formed on the electronic material layer to be opposite to the lower electrode 110, for example, to an OLED.

Figure 3:
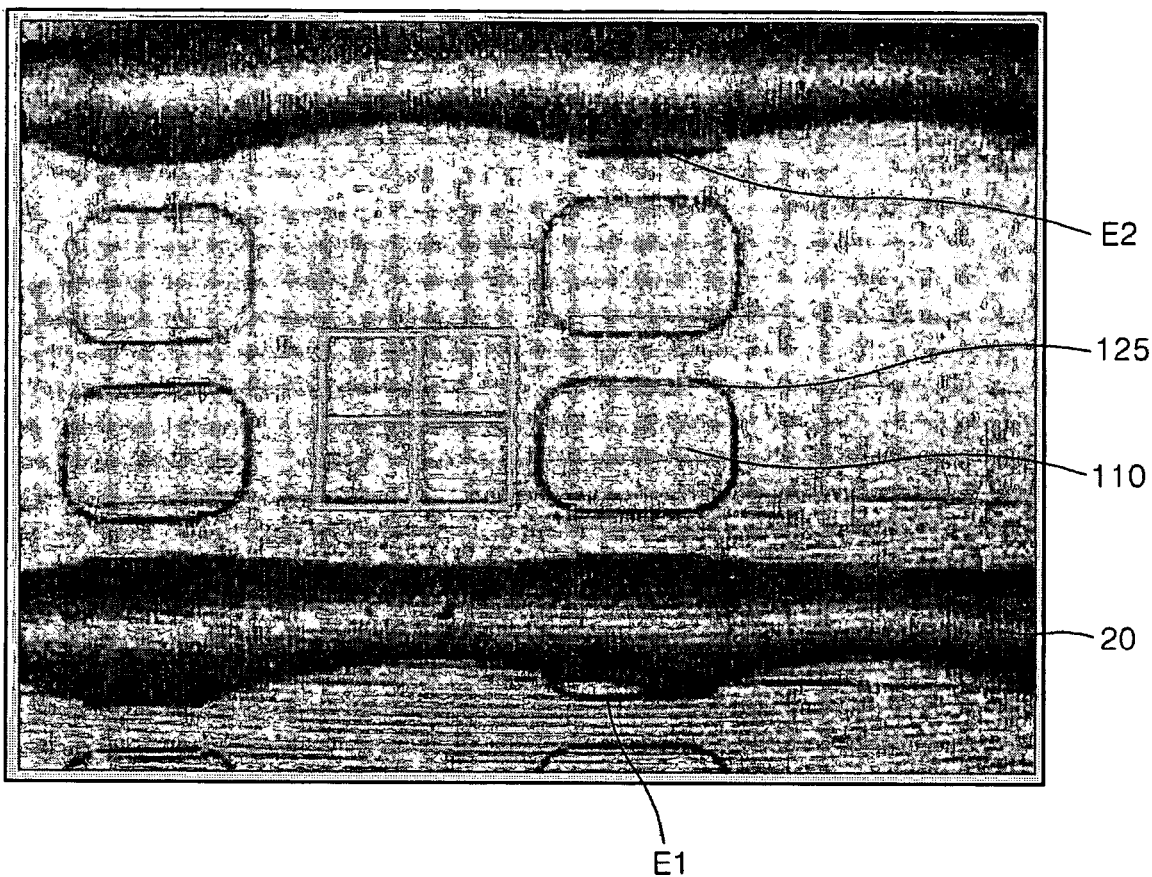
FIG. 3 is a photographic image of a fluid organic light emitting material dispensed on the pixel structure of FIG. 1.

FIG. 3 is a photographic image illustrating an organic light emitting material dispensed on the pixel structure of FIG. 1. A fluid organic light emitting material 20 having a color is dispensed in a linear pattern to pixel regions in which the colored light will be emitted. The dispensed fluid organic light emitting material 20 is filled and dried in the opening portion 125 of the bank 120, thereby forming an organic light emitting layer. The fluid organic material 20 may not be sufficiently filled near inner sidewalls of the opening portion 125 as indicated by defects E1 and E2 in FIG. 3. According to an embodiment of the present invention, however, the lower electrode 110 is not exposed even if the defects E1 and E2 are produced and only the margin regions located at both sides of the lower electrode 110 are exposed, thereby not directly affecting the capability of the organic light emitting device.

Figure 4:
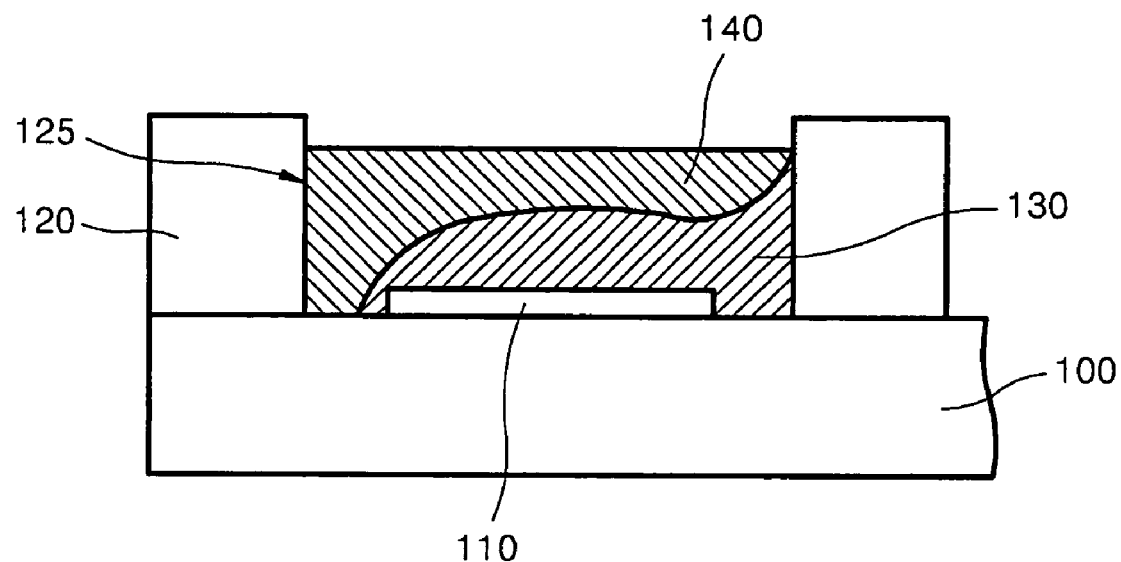
FIG. 4 is a cross-sectional view of an organic light emitting device according to an embodiment of the invention.

FIG. 4 is a cross-sectional view of an organic light emitting device according to an embodiment of the invention. An organic light emitting layer 130 covers the upper portion of a lower electrode 110 in an opening portion 125 of a bank 120 and an upper electrode 140 covers the organic light emitting layer 130. As illustrated in FIG. 4, the organic light emitting layer 130 does not cover the entire bottom surface of the opening portion 125 and thus a defect is produced at the side of the bank 120. However, the organic light emitting layer 130 covers the lower electrode 110 sufficiently. Thus, a short between the upper electrode 140 and the lower electrode 110 is prevented.

Also, a profile of the organic light emitting layer 130 located on the lower electrode 110 can be improved. In other words, even if the thicknesses of the edge portions of the organic light emitting layer 130 are uneven, the central portion of the organic light emitting layer 130 located on the lower electrode 110 can have a uniform thickness. Thus, an organic light emitting display including multiple OLEDs can provide a uniform brightness.

Figure 5:
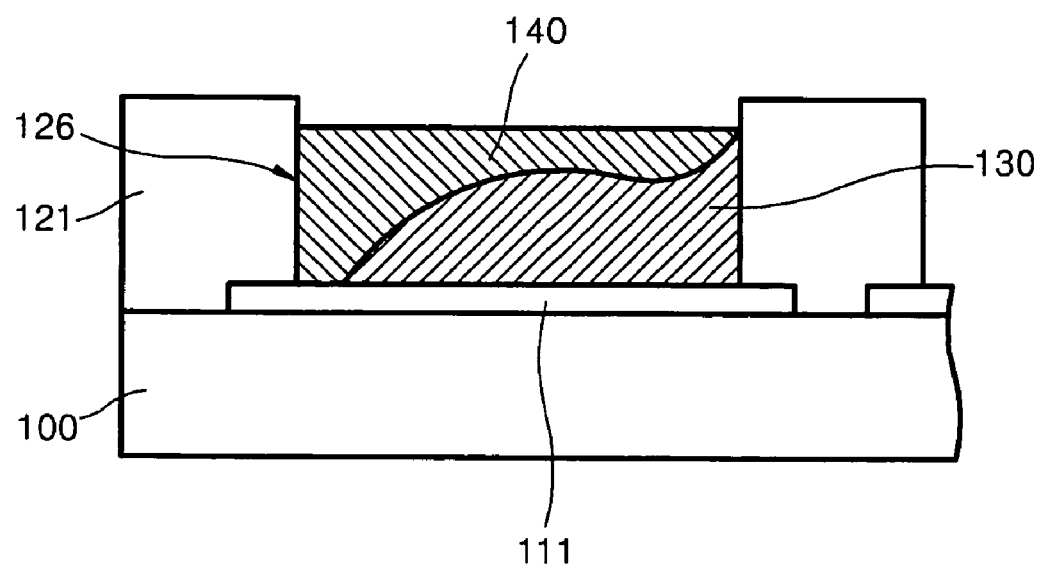
FIG. 5 is a cross-sectional view of a conventional organic light emitting device comparative to the embodiment of FIG. 4.

FIG. 5 is a cross-sectional view of a conventional organic light emitting device comparative to the embodiment of FIG. 4. The comparative embodiment has a conventional pixel structure. An opening portion 126 of a bank 121 exposes a portion of a lower electrode 111. On the lower electrode 111, an organic light emitting layer 130 and an upper electrode 140 are stacked successively. In this case, the lower electrode 111 is formed on the entire bottom surface of the opening portion 126. When a defect is caused in the edge portions of the organic light emitting layer 130 as illustrated in FIG. 5, a short is formed between the upper electrode 140 and the lower electrode 111 and thus a bad pixel is produced. Also, even if the defect is not caused, the profile of the organic light emitting layer 130 on the lower electrode 111 is not even, thereby deteriorating brightness uniformity.

A pixel structure having at least one electronic material layer between lower and upper electrodes, according to the present invention, is designed to facilitate an ink-jet or dispensing process of forming the electronic material layer, to reduce the possibility of electrical shorts between the lower and upper electrodes, and to improve the profile of the electronic material layer on the lower electrode. An organic light emitting device according to the present invention includes the pixel structure.

According to the present invention, the non-uniformity problem easy to be produced at the electronic material layer near the bank is solved, and the uniformity of the active region of the pixel, that is, a region in which the upper electrode overlaps with the lower electrode, is improved. Therefore, when the organic light emitting device according to the present invention is applied to an organic light emitting display device, brightness uniformity is improved.

While the present invention has been particularly shown and described with reference to an exemplary embodiment thereof, it will be understood by those of ordinary skill in the art that various modifications in form and detail can be made therein without departing from the spirit and scope of the present invention as defined by the following claims.

What is claimed is:

1. A pixel structure, comprising:
    at least one electronic material layer arranged between a lower electrode and an upper electrode;
    a substrate having the lower electrode arranged in a desired pattern thereon; and
    a bank covering the substrate having the lower electrode is arranged thereon, and defining an opening portion to expose at least a portion of the lower electrode;
    wherein the opening portion has an area greater than that of the exposed portion of the lower electrode, and
    wherein the bank is a single uniform structure that includes entirely straight line shaped sidewalls that extend above the lower electrode and come in contact with the upper electrode and the electronic material layer,
    wherein a portion of the upper electrode comes in direct contact with the substrate without coming in contact with the lower electrode.

2. The pixel structure of claim 1, wherein the lower electrode comprises either a width-constant linear or dot-shaped pattern and wherein the opening portion of the bank has a width greater than that of the lower electrode.

3. The pixel structure of claim 2, wherein the bank is arranged to have equal-sized margins between sidewalls of the opening portion and sides of the lower electrode.

4. A pixel structure comprising:
    a lower electrode;
    an upper electrode;
    at least one electronic material layer arranged between the lower electrode and the upper electrode;
    a substrate having the lower electrode arranged in a desired pattern thereon; and
    a bank covering the substrate having the lower electrode arranged thereon, and defining an opening portion to expose at least a portion of the lower electrode, the opening portion having an area greater than that of the exposed portion of the lower electrode;
    wherein the at least one electronic material layer is arranged in the opening portion and covers an upper surface of the lower electrode, and
    wherein the bank is a single uniform structure that includes entirely straight line shaped sidewalls that extend above the lower electrode and come in contact with the upper electrode and the electronic material layer,
    wherein a portion of the upper electrode comes in direct contact with the substrate without coming in contact with the lower electrode.

5. The pixel structure of claim 4, wherein the electronic material layer is formed by coating a fluid electronic material in the opening portion and drying the fluid electronic material.

6. The pixel structure of claim 5, wherein the electronic material layer is coated by one of dispensing, ink-jet or spin coating.

7. The pixel structure of claim 4, wherein the lower electrode comprises either a width-constant linear or dot-shaped pattern and wherein the opening portion of the bank has a width greater than that of the lower electrode.

8. The pixel structure of claim 7, wherein the bank is arranged to have equal-sized margins between sidewalls of the opening portion and sides of the lower electrode.

9. An organic light emitting device, comprising:
    a pixel structure having a lower electrode, an upper electrode, and at least one electronic material layer arranged between the lower electrode and the upper electrode, the pixel structure including:
    a substrate having the lower electrode arranged in a desired pattern thereon;
    a bank covering the substrate having the lower electrode arranged thereon, and defining an opening portion to expose at least a portion of the lower electrode, the opening portion having an area greater than that of the exposed portion of the lower electrode,
    wherein the at least one electronic material layer has an organic light emitting material layer and the organic light emitting material layer is arranged in the opening portion and covers an upper surface of the lower electrode, and
    wherein the bank is a single uniform structure that includes entirely straight line shaped sidewalls that extend above the lower electrode and come in contact with the upper electrode and the electronic material layer,
    wherein a portion of the upper electrode comes in direct contact with the substrate without coming in contact with the lower electrode.

10. The organic light emitting device of claim 9, wherein the organic light emitting material layer is formed by coating the opening portion with a fluid material and drying the fluid material.

11. The organic light emitting device of claim 10, wherein the organic light emitting material layer is formed by one of dispensing, ink-jet or spin coating.

12. The organic light emitting device of claim 9, wherein the lower electrode comprises either a linear or dot-shaped pattern and wherein the opening portion of the bank has a width greater than that of the lower electrode.

13. The organic light emitting device of claim 12, wherein the bank is arranged to have equal-sized margins between sidewalls of the opening portion and sides of the lower electrode.

* * * * *